(12) United States Patent
Yandoc et al.

(10) Patent No.: US 11,973,009 B2
(45) Date of Patent: Apr. 30, 2024

(54) LEAD FRAME ASSEMBLY FOR A SEMICONDUCTOR DEVICE

(71) Applicant: NEXPERIA B.V., Nijmegen (NL)

(72) Inventors: Ricardo Lagmay Yandoc, Nijmegen (NL); Dave Anderson, Nijmegen (NL); Adam Richard Brown, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/919,426

(22) Filed: Jul. 2, 2020

(65) Prior Publication Data
US 2021/0005538 A1 Jan. 7, 2021

(30) Foreign Application Priority Data
Jul. 3, 2019 (EP) .................................... 19184250

(51) Int. Cl.
*H01L 23/495* (2006.01)

(52) U.S. Cl.
CPC .. *H01L 23/49524* (2013.01); *H01L 23/49555* (2013.01)

(58) Field of Classification Search
CPC ......... H01L 23/49524; H01L 23/49555; H01L 21/50
See application file for complete search history.

(56) References Cited

U.S. PATENT DOCUMENTS

| | | | | |
|---|---|---|---|---|
| 6,307,755 B1 * | 10/2001 | Williams | ............ | H01L 23/4334 361/813 |
| 6,762,067 B1 * | 7/2004 | Quinones | ............ | H01L 23/488 257/E23.023 |
| 2002/0140067 A1 * | 10/2002 | Hori | .................... | H01L 23/3107 257/796 |
| 2004/0080028 A1 * | 4/2004 | Yanagisawa | ............ | H01L 24/40 257/676 |
| 2005/0224925 A1 | 10/2005 | Chou et al. | | |
| 2007/0108564 A1 * | 5/2007 | Tang | .................. | H01L 23/4334 257/E23.044 |
| 2007/0228556 A1 * | 10/2007 | Hosseini | ................. | H01L 24/84 257/E23.044 |
| 2009/0008775 A1 | 1/2009 | Tanaka et al. | | |
| 2010/0109135 A1 * | 5/2010 | Jereza | ............... | H01L 23/49524 257/676 |

(Continued)

FOREIGN PATENT DOCUMENTS

WO  2007061558 A3  5/2007

OTHER PUBLICATIONS

EP 2093793, Manufacturing Method of Semiconductor Device; Muto et al.; published Jan. 28, 2009.*

(Continued)

*Primary Examiner* — Peniel M Gumedzoe
(74) *Attorney, Agent, or Firm* — Ruggiero, McAllister & McMahon LLC

(57) ABSTRACT

This disclosure relates to a lead frame assembly for a semiconductor device, a semiconductor device and an associated method of manufacture. The lead frame assembly includes a die attach structure and a clip frame structure. The clip frame structure includes a die connection portion configured to contact a contact terminal on a top side of the semiconductor die; and a continuous lead portion extending along the die connection portion. The continuous lead portion is integrally formed with the die connection portion.

12 Claims, 5 Drawing Sheets

(56) References Cited

U.S. PATENT DOCUMENTS

2010/0193921 A1* 8/2010 Jereza .................... H01L 24/39
257/676
2014/0084433 A1 3/2014 Otremba et al.
2014/0361419 A1* 12/2014 Xue ................. H01L 23/49568
257/676
2019/0190391 A1* 6/2019 Takahashi ......... H02M 3/33507

OTHER PUBLICATIONS

Extended European Search Report for priority European application No. EP19184250.9, 9 pages, dated Jan. 21, 2020.

* cited by examiner

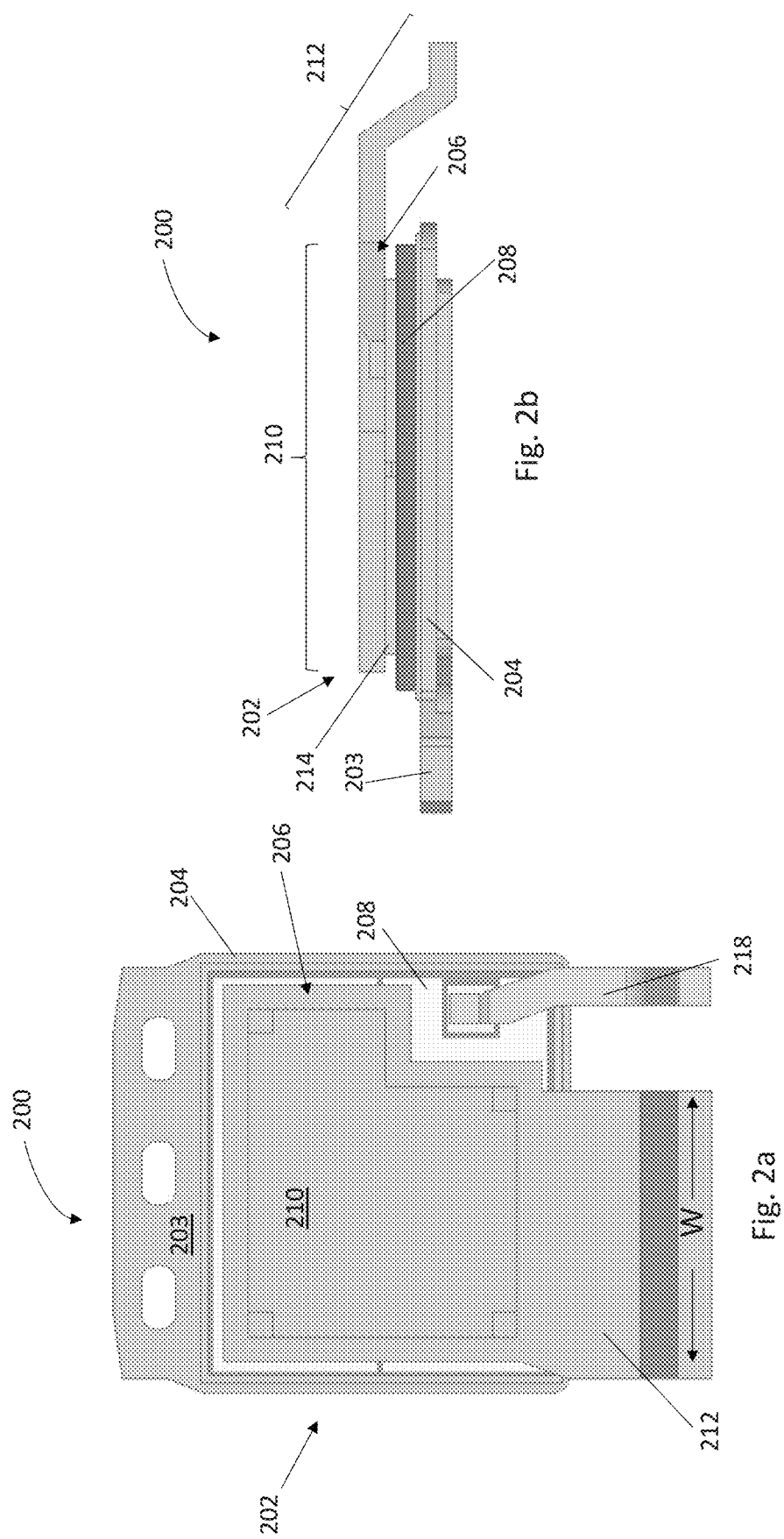

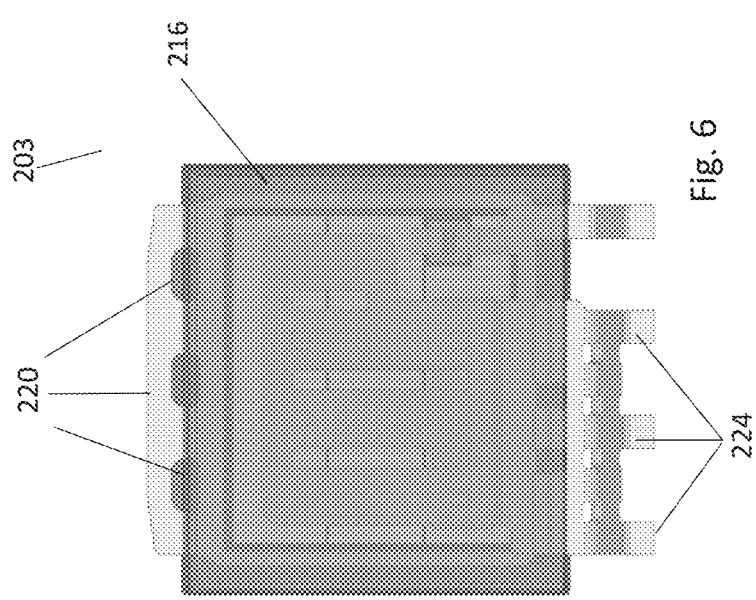
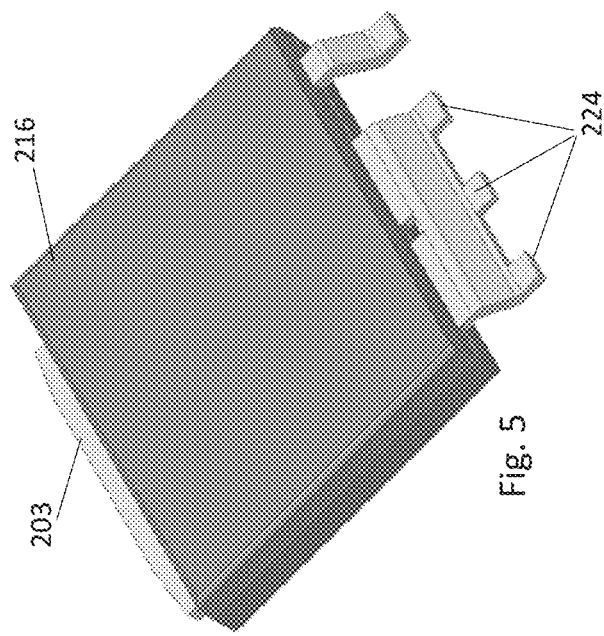

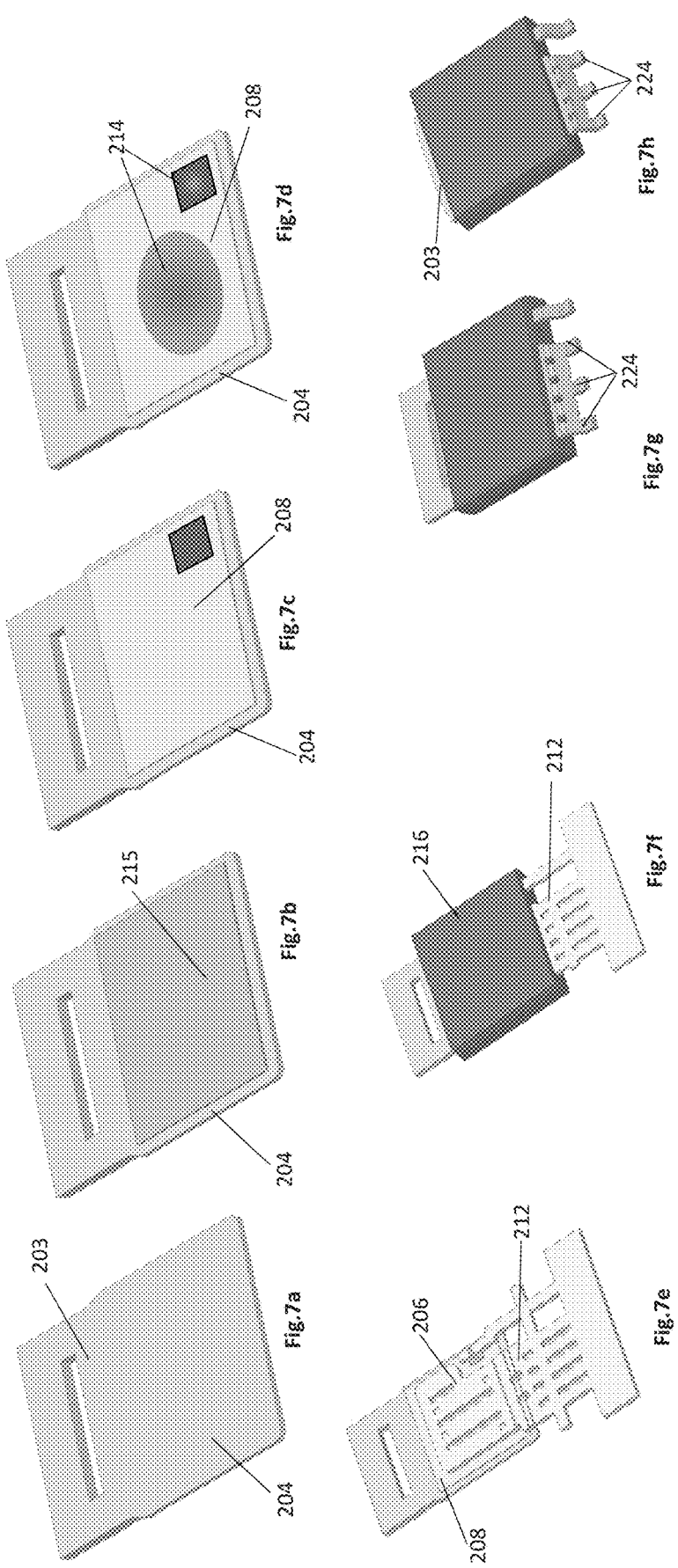

LEAD FRAME ASSEMBLY FOR A SEMICONDUCTOR DEVICE

CROSS REFERENCE TO RELATED APPLICATION

This application claims the benefit under 35 U.S.C. § 119(a) of European Application No. 19184250.9 filed Jul. 3, 2019 the contents of which are incorporated by reference herein in their entirety.

BACKGROUND OF THE DISCLOSURE

1. Field of the Disclosure

The present disclosure relates to a lead frame assembly for a semiconductor device. In particular the present disclosure relates a clip frame structure for a semiconductor device, a semiconductor device comprising the same and an associated method of manufacturing the semiconductor device.

2. Description of the Related Art

In semiconductor devices, clip bonded packages are commonly used as lead frame arrangements to make connections from a semiconductor die to external contacts of the device. Clip bonded packages have a number of advantages over conventional wire bonded packages. For example, clip bonded packages are typically used for mechanically robust and reliable electrical connections to and from the semiconductor die in automotive applications. Furthermore, the conductive clip material may have increased thermal mass compared to the wire bond material and can thus act as a heat sink for the semiconductor die.

Existing known lead frame arrangements for semiconductor devices, such as the type shown in FIGS. 1a and 1b, result in increased connection resistance between semiconductor die and the external leads. As shown in FIGS. 1a and 1b, semiconductor device 100 comprises a semiconductor die 104 mounted on a die pad 106. A clip member 102 electrically connects contact terminals on a top surface of the semiconductor die 104 to external leads 108. As shown in FIG. 1b, the clip member is electrically connected to and mechanically bonded to the external leads 108 using a solder connection 110. This solder connection 110 results in increased connection resistance which can result in increased device resistance. For example, in a MOSFET semiconductor device, where the clip member is a source connection, the increased resistance may result in increased drain-source on resistance, $R_{dson}$.

SUMMARY

Various example embodiments are directed to issues such as those addressed above and/or others which may become apparent from the following disclosure concerning improving lead frame arrangements for semiconductor devices.

In certain example embodiments, aspects of the present disclosure involve semiconductor devices comprising improved lead frame arrangements and a method of manufacturing such semiconductor devices.

According to an embodiment there is provided a lead frame assembly for a semiconductor device, the lead frame assembly comprising: a die attach structure and a clip frame structure, the clip frame structure comprising: a die connection portion configured for contacting a contact terminal on a top side of the semiconductor die; and a continuous lead portion extending along the die connection portion; wherein the continuous lead portion is integrally formed with the die connection portion.

The continuous lead portion may be a merged lead portion which extends substantially across the width of the die connection portion. The continuous lead portion may be configured and arranged to maximise operating current and minimise spreading resistance of the clip frame structure. The continuous lead portion may comprise one or more bends therein configured and arranged to allow the lead portion to contact a carrier. The continuous lead portion may further comprise a plurality of lead ends.

There is also provided a semiconductor device, comprising a lead frame assembly according to embodiments.

According to an embodiment there is also provided a method of manufacturing a semiconductor device, the method comprising: providing a lead frame assembly; mounting a semiconductor die on a die attach structure of the lead frame assembly; providing a clip frame structure, the clip frame structure comprising: a die connection portion configured to contacting a contact terminal on a top side of the semiconductor die; and a continuous lead portion extending along the die connection portion; wherein the continuous lead is portion integrally formed with the die connection portion.

The continuous lead portion may be a merged lead portion and may be formed to extend substantially across the width of the die connection portion. The continuous lead portion may be configured and arranged to maximise operating current and minimise spreading resistance of the clip frame structure.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 2a illustrates a perspective view of a lead frame arrangement according to an embodiment.

FIG. 2b illustrates a side view of a lead frame arrangement according to an embodiment.

FIG. 5 illustrates a perspective view of a semiconductor device according to an embodiment.

FIG. 6 illustrates a top view of a semiconductor device according to an embodiment.

FIGS. 7a to 7h illustrate the process steps for manufacturing a semiconductor device according to an embodiment.

DETAILED DESCRIPTION

Figure 1B:
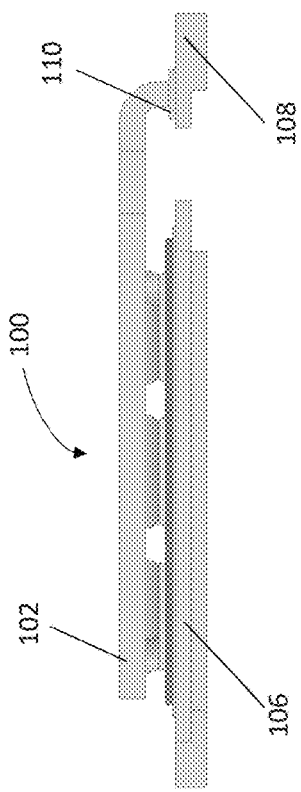
FIG. 1b shows a side view of a known lead frame arrangement.
Figure 1A:
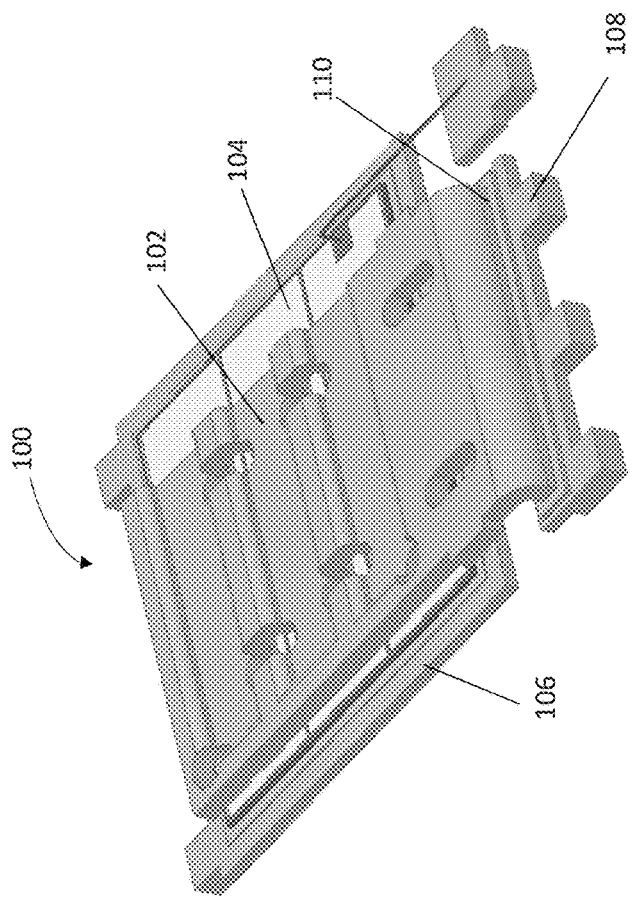
FIG. 1a shows a perspective view of a known lead frame arrangement.

In overview, a semiconductor device 200 prior to moulding and comprising a lead frame assembly 202 according to an embodiment is illustrated in FIGS. 2a and 2b. The semiconductor device 200 generally comprises a die attach structure 204 and a clip frame structure 206, forming the lead frame assembly 202, and a semiconductor die 208 attached to both the die attach structure 204 and the clip frame structure 206.

The die attach structure 204 is typically arranged for mounting a semiconductor die 208 thereon and providing support for the clip frame structure 206. In addition, the die attach structure 204 may, depending on the arrangement of contact terminals, such as source, gate or drain, of semiconductor die 208, provide contact to a back-side or bottom contact of the semiconductor die 208. The die attach structure 204 is typically formed of a metallic conductive material, such as copper. In this way the die attach structure 204 may provide a bottom external lead 203, such as a drain contact or tab, to a back-side or bottom contact terminal arranged on the semiconductor die 208. The bottom external lead 203 may extend outside of the moulded package material of the semiconductor device 200 to form a heat sink tab to the bottom of the semiconductor die 208, as illustrated for example in FIG. 5.

The semiconductor die 208 is fixedly arranged on the die attach structure 204, and the clip frame structure 206 is fixedly connected to the semiconductor die 208 and the die attach structure 204. In the embodiment of FIGS. 2a and 2b, the clip frame structure 206 is formed of two distinct but integrally formed parts, namely: a die connection portion 210; and a lead portion 212. The die connection portion 210 may be generally rectangular in shape and/or may be dimensioned such that it substantially corresponds to the dimensions of a contact terminal on the top side of the semiconductor die 208 to which the die connection portion 210 is attached.

As discussed above, the bottom or backside contact terminal of the semiconductor die 208 may be fixedly attached to the die attach structure 204. The semiconductor die 208 may be fixedly attached to and may be electrically connected, via a bottom contact terminal (not illustrated) to the die attach structure 204 using any suitable bonding material such as a solder or a conductive adhesive. The die connection portion of the clip frame structure 206 is fixedly attached to the contact terminal arranged on a top side of the semiconductor die 208, using an appropriate bonding material, such as for example, a solder or a conductive adhesive.

The lead portion 212 is a continuous and merged section extending from the die connection portion 210. The lead portion 212 is continuous in that forms a substantially elongate member extending away from and along the width of the die connection portion 210. In this way, the lead portion 212 has a continuous width W and may be seen as a merged member, that is without bifurcation or plurality of finger like lead members, which extends substantially along the width of the die connection portion 210.

The lead portion 212 is arranged as a so-called "gull wing" lead having one or more angles or bends to allow the lead portion to contact the PCB. The lead portion 212 being continuous and merged may be arranged as a plate like member having the appropriate gull-wing bends formed therein.

The lead portion 212 can be dimensioned such that it aligns or corresponds to the footprint of the contacts on a PCB (not illustrated). By maximizing the width, W, of the lead portion 212 and thus the volume thereof (assuming a constant length and thickness of the lead portion 212) current handling in terms of maximum allowable operating current, such as drain source current, of the clip frame structure 206 and semiconductor device 200 can be maximised. Likewise, the above discussed arrangement will minimise the spreading resistance of the clip frame structure 206 and thus reduce the on resistance of the semiconductor device 200.

By arranging the lead portion in this way it is possible to reduce the reduce the package resistance of the lead frame assembly 202 and thus reduce the operating resistance, such as Rdson, of the semiconductor device 200. However, the above arrangement does not significantly increase the inductance of the lead frame assembly 202. For example, according to embodiments the resistance of the clip frame structure may be 0.34717 mΩ with an inductance of 1.9718 nH. Whereas, for a known arrangement the resistance of the clip frame structure may be 0.49792 mΩ with an inductance of 1.9898 nH.

The semiconductor die 208 and the clip frame structure 206 is then encapsulated using a moulding material 216 (as illustrated for example in FIG. 5). The lead portion 212 and the bottom external lead 203 project through the mould compound 216 to allow the lead portion 212 and the bottom external lead 203 to contact an external carrier such as a PCB.

The clip frame structure 206 is typically formed from a single unitary sheet of metal, such as copper, which is formed or stamped to produce the desired structure. In this way the thickness of the die connection portion 210 and a lead portion 212 of the clip frame structure 206 may be equal. The choice of metal is entirely at the choice of the skilled person and may be chosen dependent on the required electrical characteristics of the lead frame assembly for the semiconductor device 200.

Figure 4:
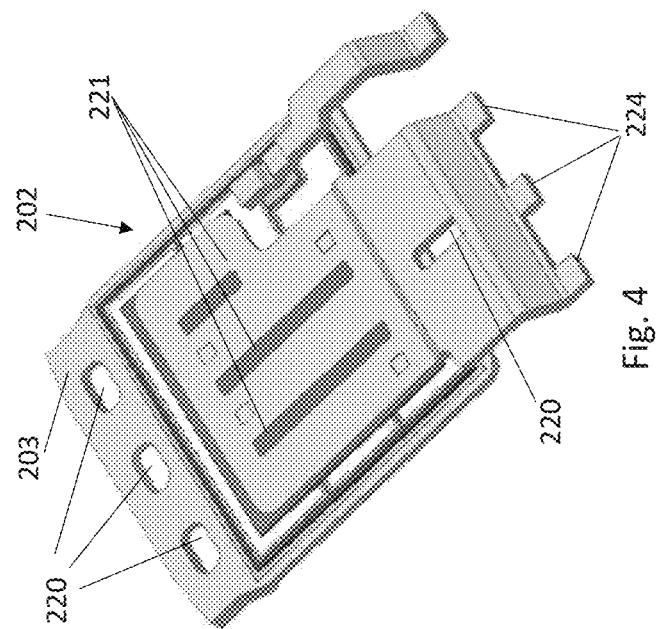
FIG. 4 illustrates a perspective view of a clip arrangement according to an embodiment.
Figure 3:
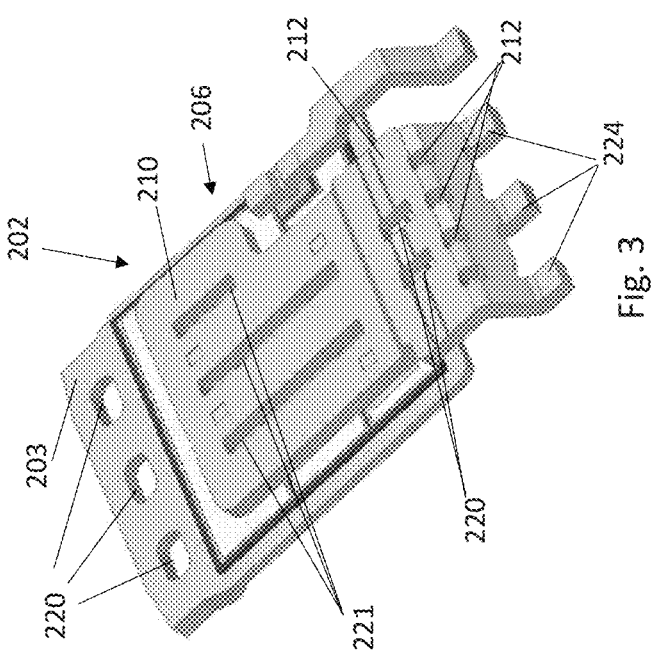
FIG. 3 illustrates a perspective view of a lead frame arrangement according to an embodiment.

FIGS. 3 and 4 illustrate a further embodiment of the lead frame assembly 202. Consistent with the arrangement described above with respect to FIGS. 2a and 2b, the arrangement of FIGS. 3 and 4 includes generally comprises a die attach structure 204 and a clip frame structure 206, forming the lead frame assembly 202, and a semiconductor die 208 attached to both the die attach structure 204 and the clip frame structure 206.

The arrangement of FIGS. 3 and 4 also includes a number of optional slots or holes 220 formed through the die connection portion 210 and the bottom external lead 203. The slots or holes 220 act as anchor or locking points for the mould compound 216 and allow for improved adhesion or attachment of the mould compound 216 to the lead frame assembly 202. Improved adhesion of mould compound prevents can reduce stress and package cracking during lead forming, that is cutting and bending of the die connection portion 210 and or the bottom external lead 203 post moulding.

In addition, optional slots or holes 221 formed through the die connection portion 210 traverse or extend lengthways across the die connection portion 210. This allows for both stress relief and solder protection.

In terms of stress relief, the holes or slots 221 formed in the die connection portion 210 reduce stress spreading across the surface of the die connection portion 210 as it is fixed to the terminal arranged on the top surface of the semiconductor die. In other words the holes or slots 221 distort the stress induced the die connection portion 210 so stress does not propagate across the die connection portion 210. In terms of solder protection, the holes or slots 221 allow for gasses to escape from under the die connection portion 210 during solder reflow processes.

Optional slots or holes 212 may also be incorporated in the lead portion 212 to prevent the leads from springing back, due to the elastic return of the metal after formation of the leads. This also makes the leads more flexible during board level temperature cycling which can prevent the solder joints of the leads to the PCB from breaking or cracking.

The arrangement of FIGS. 3, 4 and 5 also illustrate one or more optional lead end portions 224 arranged at one end of the lead portion 212 distal to the die connection portion 210. The lead end portions 224 and the lead portion 212 may comprise one or more bends 230 intermediate the die connection portion 210 and an extremity of the lead end portions 224, such that the leads are formed as so-called "gull wing" leads. The lead end portions 224 may be arranged in any standard lead geometry as required by the footprint of the contacts on a PCB. For example, the lead geometry may be the Small Outline Integrated Circuit (SOIC) such as SO8, SO14, SO16 or any other appropriate package outline.

According to embodiments, clip frame structure 206 may form a source connection to a source terminal on top side of the semiconductor die 208. A lead 218 may form a gate connection to a gate terminal also formed on the top side of the semiconductor die 208. The bottom external lead 203 may form a drain connection to a drain terminal formed on the back side of the semiconductor die 106. In this regard the semiconductor die 106 may be a field effect transistor.

Likewise, the semiconductor die 208 may be a bipolar junction transistor. The clip frame structure 206 may form a collector connection to a collector terminal on the top side of the semiconductor die 208. The lead 218 may form a base connection to a base terminal also formed on the top side of the semiconductor die 208. The bottom external lead 203 may form an emitter connection to an emitter terminal formed on the back side of the semiconductor die 208.

FIG. 6, illustrates the slots or holes 220 arranged in the bottom external lead 203 anchoring the mould compound 216 to the bottom external lead 203 so as to allow for improved adhesion or attachment of the mould compound 216 to the bottom external lead 203.

FIGS. 7a to 7h illustrate the process flow steps for manufacturing a semiconductor device according to embodiments.

As illustrated in FIG. 7a, the die attach structure 204 with a bottom external lead 203 extending therefrom is provided. The die attach structure 204 and bottom external lead 203 may be formed of any appropriate conductive material such as copper. The arrangement of FIG. 7a shows a single die attach structure 204, however the skilled person will appreciate that a plurality of die attach structures may be arranged in a strip or matrix.

In the next step, as illustrated in FIG. 7b, a die attach material 215 is dispensed onto the die attach structure 204. The die attach material 215 is arranged for fixedly mounting the semiconductor die 208 to the die attach material 215, as illustrated in FIG. 7c. The die attach material 215 may be any appropriate adhesive material such as a solder or conductive adhesive.

Following placement of the semiconductor die 208, a contact terminal attach material is dispended on the top side contact of the semiconductor die 208 for electrical and mechanical connection of the clip frame structure 206 to the semiconductor die 208 as illustrated in FIG. 7d. The die attach material may be applied by any appropriate process such as adhesive or solder printing or dispense.

Once the semiconductor die 208 is in place on the die attach structure 204, the contact terminal attach material 214 is arranged on the one or more top contacts of the semiconductor die 208. The clip frame structure 206 may then be arranged on the contact terminals, as illustrated in FIG. 7e. Whilst the arrangement of FIG. 7e illustrates a single clip frame structure 206 arranged on the semiconductor die 208, the skilled person will appreciate that a plurality of such clip frame structures may be arranged in a strip or matrix corresponding to the plurality of die attach structures each having a semiconductor die arranged thereon. Following connection of the clip frame structure 206 the assembly undergoes solder re-flow to solidify the die attach material and the contact terminal attach material. Following re-flow, the assembly may be packaged in a mould material 216 as illustrated in FIG. 7f.

As illustrated in FIG. 7g the lead end portions 224 are formed by trimming the lead portion 212 and bending the leads to form the gull-wing arrangement. The process is completed in FIG. 7h by trimming of the bottom external lead 203.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A lead frame assembly for a semiconductor device, the lead frame assembly comprising:
   a die attach structure and a clip frame structure, wherein the clip frame structure further comprises:
   a die connection portion configured to contact a source contact terminal on a top side of a semiconductor die; and
   a merged lead portion having a continuous width along the die connection portion, wherein the merged lead portion does not divide into a plurality of finger-like lead members extending away from the die connection portion, wherein the merged lead portion is integrally formed with the die connection portion, and wherein the merged lead portion further comprises one or more bends therein configured and arranged to allow the merged lead portion to reach a top surface of a carrier.

2. The lead frame assembly of claim 1, wherein the merged lead portion extends substantially across a width of the die connection portion.

3. The lead frame assembly of claim 2, wherein the merged lead portion is configured and arranged to maximise operating current and minimise spreading resistance of the clip frame structure.

4. The lead frame assembly of claim 3, further comprising a plurality of lead ends arranged at an end of the merged lead portion distal to the die connection portion.

5. A semiconductor device, comprising the lead frame assembly of claim 3.

6. The lead frame assembly of claim 2, further comprising a plurality of lead ends arranged at an end of the merged lead portion distal to the die connection portion.

7. A semiconductor device, comprising the lead frame assembly of claim 2.

8. The lead frame assembly of claim 1, further comprising a plurality of lead ends arranged at an end of the merged lead portion distal to the die connection portion.

9. A semiconductor device, comprising the lead frame assembly of claim 1.

10. A method of manufacturing a semiconductor device, the method comprising:

providing a lead frame assembly;

mounting a semiconductor die on a die attach structure of the lead frame assembly;

providing a clip frame structure, the clip frame structure comprising:

a die connection portion configured to contact a source contact terminal or a collector contact terminal on a top side of the semiconductor die; and a merged lead portion having a continuous width along the die connection portion, wherein the merged lead portion does not divide into a plurality of finger-like lead members, wherein the merged lead portion is a portion integrally formed with the die connection portion, and wherein the merged lead portion further comprises an intermediate portion having one or more bends therein configured and arranged to allow the intermediate portion of the merged lead portion to project through a mold compound to allow the merged lead portion reach a top surface of an external carrier.

11. Method of claim 10, wherein the merged lead portion is formed to extend substantially across a width of the die connection portion.

12. The method of claim 11, wherein the merged lead portion is configured and arranged to maximise operating current and minimise spreading resistance of the clip frame structure.

* * * * *